(12) United States Patent
Ominami et al.

(10) Patent No.: US 9,208,995 B2
(45) Date of Patent: Dec. 8, 2015

(54) CHARGED PARTICLE BEAM APPARATUS

(71) Applicant: Hitachi High-Technologies Corporation, Minato-ku, Tokyo (JP)

(72) Inventors: Yusuke Ominami, Tokyo (JP); Takashi Ohshima, Tokyo (JP); Hiroyuki Ito, Tokyo (JP); Mitsugu Sato, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/379,291

(22) PCT Filed: Feb. 15, 2013

(86) PCT No.: PCT/JP2013/053737
§ 371 (c)(1),
(2) Date: Aug. 16, 2014

(87) PCT Pub. No.: WO2013/129143
PCT Pub. Date: Sep. 6, 2013

(65) Prior Publication Data
US 2015/0014530 A1  Jan. 15, 2015

(30) Foreign Application Priority Data

Feb. 27, 2012 (JP) ................................ 2012-039500

(51) Int. Cl.
| | |
|---|---|
| *G21K 5/00* | (2006.01) |
| *H01J 37/28* | (2006.01) |
| *H01J 37/16* | (2006.01) |
| *H01J 37/18* | (2006.01) |
| *H01J 37/09* | (2006.01) |

(Continued)

(52) U.S. Cl.
CPC ................ *H01J 37/28* (2013.01); *H01J 37/09* (2013.01); *H01J 37/16* (2013.01); *H01J 37/18* (2013.01); *H01J 2237/0451* (2013.01); *H01J 2237/06341* (2013.01); *H01J 2237/10* (2013.01); *H01J 2237/2801* (2013.01)

(58) Field of Classification Search
USPC ............. 250/396 R, 397, 306, 307, 309, 310, 250/311, 492.1, 492.2, 492.3
See application file for complete search history.

(56) References Cited

U.S. PATENT DOCUMENTS

| | | |
|---|---|---|
| 2006/0249677 A1 | 11/2006 | Chao et al. |
| 2010/0051803 A1 | 3/2010 | Koizumi et al. |

(Continued)

FOREIGN PATENT DOCUMENTS

| | | |
|---|---|---|
| JP | 02-139842 A | 5/1990 |
| JP | 2006-318903 A | 11/2006 |
| JP | 2007-305499 A | 11/2007 |
| JP | 2008-153086 A | 7/2008 |
| JP | 2008-262886 A | 10/2008 |

(Continued)

*Primary Examiner* — Nicole Ippolito
(74) *Attorney, Agent, or Firm* — Miles & Stockbridge P.C.

(57) ABSTRACT

Provided is a charged particle beam apparatus (111) to and from which a diaphragm (101) can be easily attached and detached, and in which a sample (6) can be arranged under vacuum and under high pressure. The charged particle beam apparatus includes: a lens barrel (3) holding a charged particle source (110) and an electron optical system (1,2,7); a first housing (4) connected to the lens barrel (3); a second housing (100) recessed to inside the first housing (4); a first diaphragm (10) separating the space inside the lens barrel (3) and the space inside the first housing (4), and through which the charged particle beam passes; a second diaphragm (101) separating the spaces inside and outside the recessed section (100a) in the second housing (100), and through which the charged particle beam passes; and a pipe (23) connected to a third housing (22) accommodating the charged particle source (110). The first diaphragm (10) is attached to the pipe (23), and the pipe (23) and the third housing (22) can be attached to and detached from the lens barrel (3) in the direction of the optical axis (30). A space (105) surrounded by the first housing (4) and the second housing (100) is depressurized, and the sample (6) arranged inside the recessed section (100a) is irradiated with a charged particle beam.

14 Claims, 11 Drawing Sheets

(56) References Cited

U.S. PATENT DOCUMENTS

2010/0140470 A1 6/2010 Shachal
2014/0123898 A1* 5/2014 Nomaguchi ............ H01J 37/18
118/723 FI

FOREIGN PATENT DOCUMENTS

| | | |
|---|---|---|
| JP | 2010-056011 A | 3/2010 |
| JP | 2010-509709 A | 3/2010 |

* cited by examiner

CHARGED PARTICLE BEAM APPARATUS

TECHNICAL FIELD

The present invention relates to a charged particle beam apparatus that irradiates a sample with a charged particle beam.

BACKGROUND ART

In recent years, charged particle beam apparatuses such as a scanning electron microscope (SEM), a transmission electron microscope (TEM), a scanning and transmission electron microscope (STEM), a focused ion beam processing observation instrument (FIB) and the like have been used, in order to observe microscopic regions. In these apparatuses, a charged particle beam such as an electron beam or an ion beam is irradiated onto a sample. In general, these charged particle beam apparatuses are adapted to evacuate the air from a space in which a sample is placed, and perform imaging. There are plenty of needs to observe a sample using an electron microscope even under low-vacuum and/or under atmospheric pressure. Recently, SEMs that can observe a sample which is a target of observation under atmospheric pressure have been developed (see Patent Literature 1 and Patent Literature 2). These SEMs are in principle configured to provide a diaphragm through which an electron beam can pass, between an electron optical system and a sample, to thereby separate a space in vacuum state from a space in atmospheric pressure state. Any of the SEMs are common in point of providing the diaphragm between the sample and the electron optical system.

Patent Literature 1 discloses an atmospheric pressure SEM in which an electron source is arranged in the lower side of an electron optical lens barrel and an objective lens is arranged in the upper side thereof, and a diaphragm through which an electron beam can pass is provided via an O-ring on the electron-beam exit aperture at the end of the electron optical lens barrel. The sample is directly placed on the diaphragm and a primary electron beam is irradiated from the lower surface side of the sample to perform. SEM observation. Patent Literature 2 discloses arranging an electron source in the upper side of an electron optical lens barrel and an objective lens in the lower side thereof, and providing a diaphragm at a position away from a sample. An electron beam is irradiated from the upper surface side of the diaphragm to perform SEM observation. Note that the diaphragm is not only provided at the position away from the sample, but also provided near the electron source.

CITATION LIST

Patent Literature

Patent Literature 1: Japanese Patent Application Publication No. 2008-153086
Patent Literature 2: Japanese Patent Application Publication No. 2008-262886

SUMMARY OF INVENTION

Technical Problem

As for Patent Literature 1, since the sample needs to be in contact with the diaphragm, the diaphragm has to be replaced every time the sample is replaced. For this reason, it is imagined that it would take time for replacement of the sample. Moreover, when the diaphragm tears, the degree of vacuum in the space in which the electron source is arranged gets worse and a filament which emits electrons possibly breaks off.

As for Patent Literature 2, since the diaphragm is provided at the position away from the sample, the diaphragm does not need to be replaced every time the sample is replaced, and thus the diaphragm is difficult to be damaged. Moreover, since the diaphragm is also provided near the electron source, the filament never break off even if the diaphragm provided at the position away from the sample is damaged.

Note that, also in Patent Literature 2, it is imagined that it is difficult to replace the diaphragm. Since a charged particle beam is irradiated onto and passes through the diaphragm, it is imagined that the structure of molecular level constituting the diaphragm gradually deteriorates by collision of charged particles. For this reason, it is desirable that the diaphragm is regularly replaced. Accordingly, it is desirable that replacement of the diaphragm is easy. Moreover, it is useful if a conventional SEM observation in which a sample is arranged in a vacuum state could be performed by easily demounting the diaphragm. Conversely, it is useful if a SEM observation of the sample could be performed under high pressure such as atmospheric pressure which is higher in pressure than vacuum by easily mounting the diaphragm on a conventional charged particle beam apparatus in which the sample is arranged in a vacuum state.

It is therefore an object of the present invention to provide a charged particle beam apparatus to and from which a diaphragm can be easily attached and detached, and in which a sample can be arranged under vacuum and under high pressure.

Solution to Problem

Namely, the present invention provides a charged particle beam apparatus including: a charged particle source which emits a charged particle beam; a charged particle optical system which focuses the charged particle beam and controls an optical axis; a lens barrel which holds the charged particle source and the charged particle optical system; a first housing which is connected to the lens barrel and into which the charged particle beam is emitted; a second housing which is recessed to inside the first housing from an opening of the first housing; a first diaphragm which is arranged on the optical axis and separates a space inside the lens barrel from a space inside the first housing, and through which the charged particle beam passes; and a second diaphragm which is arranged on the optical axis and separates spaces inside and outside a recessed section of the second housing from each other, and through which the charged particle beam passes, wherein a space surrounded by the first housing and the second housing is depressurized, and a sample arranged inside the recessed section of the second housing is irradiated with the charged particle beam.

Moreover, the present invention provides a charged particle beam apparatus including: a charged particle source which emits a charged particle beam; a charged particle optical system which focuses the charged particle beam and controls an optical axis; a lens barrel which holds the charged particle source and the charged particle optical system; a pipe arranged to be connected to a housing which accommodates therein the charged particle source, to pass through the charged particle optical system, and to allow the optical axis to pass inside the pipe; and a diaphragm which is attached to the pipe and arranged on the optical axis and separates a space inside the pipe communicating with a space inside the housing, from a space outside the pipe, and through which the charged particle beam passes, wherein the diaphragm and the pipe are attachable to and detachable from the lens barrel when the housing is moved in a direction of the optical axis.

Advantageous Effects of Invention

According to the present invention, it is possible to provide a charged particle beam apparatus to and from which a diaphragm can be easily attached and detached, and in which a sample can be arranged under vacuum and under high pressure.

DESCRIPTION OF EMBODIMENTS

Hereinafter, embodiments of the present invention will be described in detail with reference to the drawings as appropriate. Note that in each of the drawings, the common part is given the same reference sign and its duplicate description is omitted.

First Embodiment

Regarding Configuration of Apparatus

Figure 1:
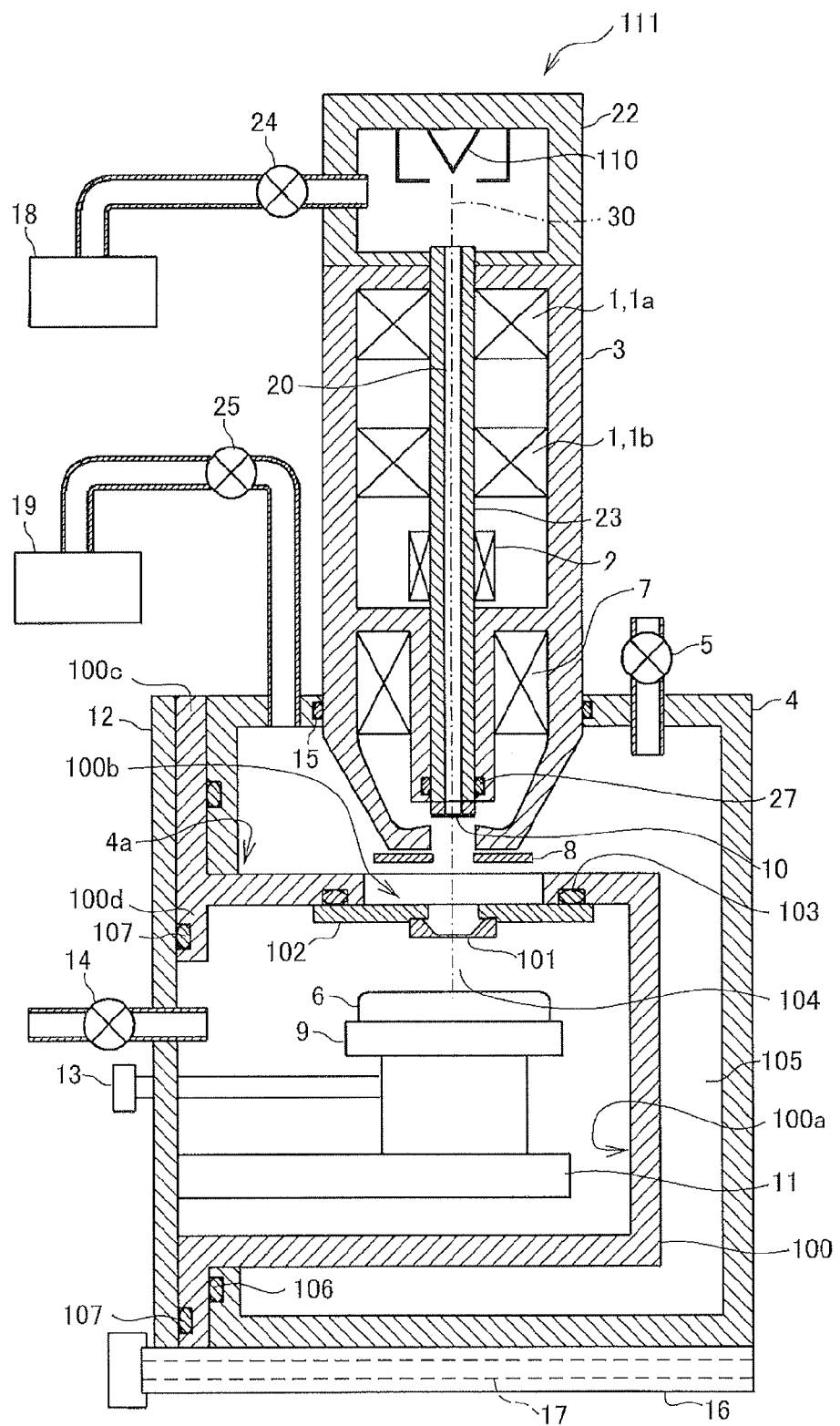
FIG. 1 is a configuration diagram of a charged particle beam apparatus (microscope) according to a first embodiment of the present invention.

FIG. 1 shows a configuration diagram of a charged particle beam apparatus (charged particle beam microscope) 111 according to a first embodiment of the present invention. Note that, although the first and second embodiments are described taking a SEM which is an electron beam apparatus, as an example of the charged particle beam apparatus (charged particle beam microscope) 111, the present invention can also be applied to the other charged particle beam apparatus (charged particle beam microscope) 111. The present charged particle beam apparatus (charged particle beam microscope) 111 makes it possible to irradiate a charged particle beam onto a sample 6 arranged under atmospheric pressure and observe the sample 6. This charged particle beam apparatus 111 includes: an electron source 110 for emitting an electron beam (charged particle beam); an electron optical lens barrel 3 that holds an electron optical system (charged particle optical system) such as an electron optical lens 1, a deflection coil 2, an electron objective lens 7 and the like, and the electron source 110; and a first housing (sample housing) 4 that is connected to and holds the electron optical lens barrel 3, and includes the sample 6. The electron source 110 is accommodated in a third housing 22. The electron optical system such as the electron optical lens 1, the deflection coil 2, the electron objective lens 7 and the like, focuses the electron beam and controls its optical axis. The electron optical lens 1 and the electron objective lens 7 focus the electron beam. The deflection coil 2 scans the optical axis 30 of focused electron beam.

The electron optical lens barrel 3 is inserted into the first housing 4 and the electron beam is emitted from the electron optical lens barrel 3 to inside the first housing 4. The first housing 4 and the electron optical lens barrel 3 are attached firmly to each other via a vacuum sealing part 15 such as an O-ring and thus air tight of a space 105 inside the first housing 4 is ensured. The first housing 4 is provided with a valve or gas inlet/outlet 5 for leaking the inside of housing to the atmosphere. Provided below the electron objective lens 7 is a detector 8 that detects a secondary signal such as secondary electrons and/or reflected electrons emitted from the sample 6 when the sample 6 is irradiated with the electron beam. A first diaphragm 10 through which the electron beam passes is arranged near the electron objective lens 7. Effects obtained by arranging the first diaphragm 10 near the electron objective lens 7 will be described later. This first diaphragm 10 separates a space 20 inside the electron optical lens barrel 3 (pipe 23) above the first diaphragm 10, from a space 105 inside the first housing 4 below. The first diaphragm 10 is arranged on the optical axis 30 of the electron beam.

A vacuum pump 18 is connected via a vacuum valve or vacuum sealing part 24 to a third housing 22 and performs vacuuming mainly for a space 20 from the electron source 110 to an upper surface of the first diaphragm 10. A vacuum pump 19 is connected via a valve 25 to the first housing 4 and performs vacuuming mainly for the space 105 from a lower surface of the first diaphragm 10 to an upper surface of a second diaphragm 101 described later. Although not shown, the vacuum pump 18 and the vacuum pump 19 may be connected to each other, and the respective pumps are not limited to a single pump and may be a plurality of pumps.

An attachment housing 100 is attached to the first housing 4. The attachment housing 100 has a box-shaped recessed section 100a, and a flange 100c which is provided on a fringe of the recessed section 100a and has a seal face on both surfaces thereof. The first housing 4 is provided with an opening 4a, and the recessed section 100a of the attachment housing 100 is inserted into the first housing 4 from the opening 4a. The recessed section 100a is recessed to inside the first housing 4 from the opening 4a of the first housing 4. The opening 4a is blocked by the attachment housing 100. The seal face of the first housing 4 which is provided around the opening 4a, and the seal face of the flange 100c of the attachment housing 100 which faces the seal face of the first housing 4, are attached firmly to each other via a vacuum sealing part 106 such as an O-ring, thereby making it possible to enable the space 105 surrounded by the first housing 4 and the attachment housing 100 to be depressurized.

The attachment housing 100 is provided with a through-hole 100b on the side of the electron optical lens barrel 3. The through-hole 100b is air-tightly blocked by a flange 102 provided with a second diaphragm 101 through which the electron beam can pass. The second diaphragm 101 separates a space 104 inside the recessed section 100a of the attachment housing 100, from the space 105 surrounded by the first housing 4 outside and the attachment housing 100. A vacuum sealing part 103 is provided on seal faces of the attachment housing 100 and the flange 102. A guard 100d is provided on the fringe of the recessed section 100a on the side on which the second diaphragm 101 (flange 102) is arranged. If the sample 6 were not set at a position lower than the guard 100d, the sample 6 would touch the guard 100d to be unable to be inserted into the recessed section 100a. Since the guard 100d is set at a position lower than the second diaphragm 101, the sample 6 can be prevented from touching the second diaphragm 101 when inserted.

A stage 11 provided with a sample holder 9 for holding the sample 6, and the like, is supported by a plate member (flange) 12. The flange 12 is supported to be attached firmly, via a vacuum sealing part 107 such as an O-ring, to the seal face of the flange 100c of the attachment housing 100. The flange 12 is supported on the side of the opening 4a of the first housing 4. Provided outside the flange 12 is a knob 13 for controlling a displacement mechanism such as slide, tilt and the like of the stage 11. In the case of an electrically-driven displacement, a motor, an actuator or the like may be provided. Moreover, the flange 12 may be provided with a valve or gas inlet/outlet 14 for gas introduction and the like. A plurality of valve or gas inlet/outlet 14 may be provided. It is also possible to fill a specific gas from the valve or gas inlet/outlet 14 into the space 104, and when the valve or gas inlet/outlet 14 is connected to a vacuum pump, it is also possible to depressurize (vacuumize or low-vacuumize) the space 104.

Since an electron beam is scattered in the atmosphere, it is desirable that the sample 6 and the second diaphragm 101 are positioned as close to each other as possible. More specifically, it is desirable that a distance between the second diaphragm 101 and the sample 6 is equal to or less than 1000 μm. This is because the distance in an atmospheric space through which an electron beam emitted with an accelerating voltage (for example, about tens of kilovolts) in a commonly-used SEM can pass is equal to or less than 1000 μm. For this reason, it is more desirable that the stage 11 is provided with a mechanism capable of changing the sample 6 in the height direction. Alternatively, a mechanism that moves the second diaphragm 101 toward the sample 6 may be provided.

Replacement of the sample 6 is carried out by moving the flange 12 in a direction to pull away from the attachment housing 100 (first housing 4) and pulling out the sample stage 11 from the recessed section 100a of the attachment housing 100. A guide 16, a rail 17 and the like may be provided so that the flange 12 can move smoothly.

Replacement of the second diaphragm 101 can be carried out by moving the flange 12, pulling out the sample stage 11 from the recessed section 100a of the attachment housing 100 and then putting one's hand inside the recessed section 100a. Alternatively, the replacement may be carried out by moving the flange 12, pulling out the sample stage 11 from the recessed section 100a of the attachment housing 100, then pulling out the recessed section 100a from the opening 4a of the first housing 4 and demounting the attachment housing 100 from the first housing 4. Thus, the number of components to be demounted for the replacement is low and the second diaphragm 101 is within easy reach and thus can be easily replaced. Note that when the attachment housing 100 is demounted from the first housing 4 as described above, it is possible to observe the sample 6 in a vacuum. Namely, since the attachment housing 100 is omitted, the flange 12 blocks the opening 4a of the first housing 4. The seal face of the flange 12 is attached firmly to the seal face around the opening 4a of the first housing 4 via the vacuum sealing part 106. Since vacuuming can be performed by the vacuum pump 19 for the spaces 104 and 105 surrounded by the flange 12 and the first housing 4, it is possible to observe the sample 6 in the vacuum. Conversely, when the attachment housing 100 with the second diaphragm 101 is only installed in a conventional charged particle beam apparatus in which the sample 6 is normally observed under vacuum, it is possible to observe the sample 6 under atmospheric pressure (high pressure).

Next, description is given of the first diaphragm 10. The space 20 in which the electron beam 110 is provided reaches the upper surface of the first diaphragm 10. The electron beam 110 is provided in the third housing 22 of a thick circular pipe shape. The first diaphragm 10 is arranged on one tip of the pipe 23 of a thin circular pipe shape, and blocks the tip. Another tip of the pipe 23 is connected to the third housing 22. The space inside the pipe 23 and the space inside the third housing 22 communicate with each other to define one space 20. This space 20 is an airtight space for which vacuuming can be performed. The pipe 23 passes through the electron optical system such as the electron optical lens 1, the deflection coil 2, the electron objective lens 7 and the like. By thinning the pipe 23, it is possible to make smaller the electron optical system such as the electron optical lens 1, the deflection coil 2, the electron objective lens 7 and the like, which is located outside the pipe 23. Even if the electron optical system is made smaller, it is possible to generate an intense magnetic field near the central axis of the pipe 23 because the distance to the central axis of the pipe 23 from the electron optical system can be made shorter. The same is true in the case where a permanent magnet or the like is used in the electron optical system. The optical axis 30 of the electron beam passes through the inside of the pipe 23. The electron optical system such as the electron optical lens 1, the deflection coil 2, the electron objective lens 7 and the like, is arranged basically in the atmosphere side. The space 20 inside the pipe 23 is under vacuum. Since electromagnetic field is generated in the space 20 inside the pipe 23 from the outside thereof, it is desirable that the pipe 23 is of a non-magnetic material.

Replacement of the first diaphragm 10 is carried out by closing the valve 25 and opening the valve or gas inlet/outlet 5, bringing the space 105 surrounded by the first housing 4 and the attachment housing 100 into atmospheric pressure, then moving the third housing 22 in an extended direction of the optical axis 30 and pulling out the pipe 23 from the electron optical lens barrel 3. The replacement of the first diaphragm 10 for the pipe 23 pulled out can be easily carried out because the first diaphragm 10 is exposed. Thus, the number of components to be demounted for the replacement is low and the first diaphragm 10 is within easy reach and thus can be easily replaced. Note that when the first diaphragm 10 is demounted from the pipe 23 pulled out and the pipe 23 without a new first diaphragm 10 is inserted into the electron optical lens barrel 3, it is possible to observe the sample 6 with the first diaphragm 10 omitted. Conversely, in a conventional charged particle beam apparatus, when the pipe 23 with the first diaphragm 10 is connected to the third housing 22, it is possible to provide the first diaphragm 10 on the optical axis 30.

Procedure for Acquisition of SEM Image

Next, description is given of the procedure for acquisition of a SEM image using the charged particle beam apparatus 101. First, the sample 6 is arranged on the sample holder 9 which is drawn out. Next, the sample 6 arranged on the sample holder 9 is inserted into the recessed section 100a of the attachment housing 100 and the flange 12 is fixed to be attached firmly to the flange 100c of the attachment housing 100. Then, an electron beam is emitted from the electron source 110. The electron beam passes through an electromagnetic field formed by the electron optical system such as the electron optical lens 1, the deflection coil 2, the electron objective lens 7 and the like, and passes through the first diaphragm 10 and the second diaphragm 101. Next, the sample 6 is caused to get near the second diaphragm 101. By causing the sample 6 to get near, the electron beam which has passed through the second diaphragm 101 can reach the sample 6 even if it progresses through the atmosphere. The electron beam reached is irradiated onto the sample 6 and reflected electrons or secondary electrons are emitted from the sample 6. Finally, the detector 8 detects these electrons to acquire the SEM image.

Regarding Diaphragms 10, 101

It is desirable that the first diaphragm 10 and the second diaphragm 101 are thin because an electron beam has to pass through the respective diaphragms. With the diaphragms too thick, the electron beam is scattered and a resolution is deteriorated. More specifically, it is desirable that a thickness of the first diaphragm 10 and the second diaphragm 101 is equal to or less than 100 nm. This is the thickness through which an electron beam can pass with an accelerating voltage (for example, about tens of kilovolts) in a commonly-used SEM. As materials of the first diaphragm 10 and the second diaphragm 101, silicon, silicon oxide, silicon nitride, silicon carbide, carbon, organic substance and the like can be used.

Figure 2:
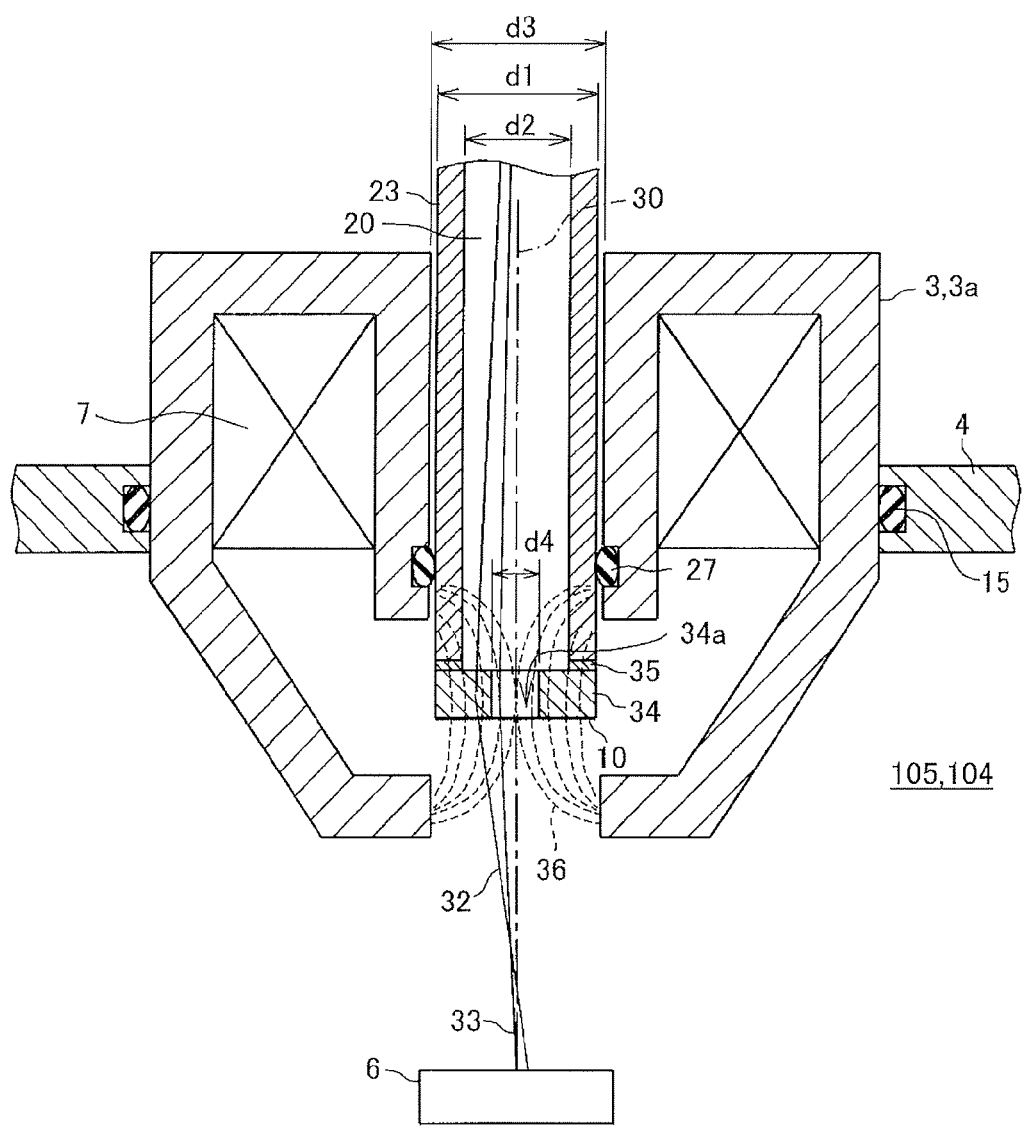
FIG. 2 is an enlarged view of an electron objective lens and its neighborhood in the first embodiment.

FIG. 2 shows an enlarged view of the electron objective lens 7 and its neighborhood. Provided around the electron objective lens 7 is a magnetic core 3a constituting part of the electron optical lens barrel 3. An electromagnetic field 36 which is generated near a gap of the magnetic core 3a produces a lens effect by which the electron beam is focused. The first diaphragm 10 is arranged at the center of lens where the most intense magnetic field appears in the middle of the electromagnetic field 36. The gap of the magnetic core 3a is open in a vertical direction (direction of the optical axis 30) and the first diaphragm 10 is arranged at a nearly middle height in the gap of the magnetic core 3a. The first diaphragm 10 has three functions.

The first function is a function of separating, by the first diaphragm 10 as described above, the space 20 in the upper side from the space 105 (104) in the lower side to thereby make it possible to produce a difference of atmosphere pressure between atmosphere pressure in the space 20 in the upper side and atmosphere pressure in the space 105 (104) in the lower side. The space 20 is maintained in a high-vacuum state because the electron source 110 (see FIG. 1) is arranged in the space 20. Since the first diaphragm 10 is attached to the pipe 23, it is possible to bring the space 20 which is in a high-vacuum state, close to the side of the sample 6. Assuming that the degree of vacuum in the space 105 is low, the electron beam can reach the sample 6 (second diaphragm 101 (see FIG. 1)). This makes it possible to use as the vacuum pump 19 (see FIG. 1), not a high-performance vacuum pump for high vacuum, but a cheap and simple vacuum pump.

The second function is a function of, even if the second diaphragm 101 (see FIG. 1) is damaged, confining inflow of air to the space 105 to prevent the air from flowing into the space 20. This makes it possible to prevent a filament of the electron source 110 from breaking off. Also, the outer periphery of the pipe 23 and the inner periphery of a magnetic core 3a (electron optical lens barrel 3) are attached firmly to each other via a vacuum sealing part 27 such as an O-ring to thereby ensure air tight of the space 105. An outer diameter d1 of the pipe 23 is smaller than an inner diameter d3 of the electron optical system such as the electron optical lens 1 (see FIG. 1), the deflection coil 2, the electron objective lens 7 and the like (d1<d3). Accordingly, it is possible to insert and remove the pipe 23 together with the first diaphragm 10 into and from the electron optical lens barrel 3 which holds the electron optical system such as the electron optical lens 1, the deflection coil 2, the electron objective lens 7 and the like.

The third function is a function of diaphragm which blocks an electron beam away from the optical axis 30. In general, a trajectory 32 of an electron beam passing away from the optical axis 30 is largely curved due to an intense electromagnetic field by the electron objective lens 7. Accordingly, the trajectory 32 deviates from a trajectory 33 of an electron beam passing near the optical axis 30, on the sample 6, and the electron beam is not focused on the surface of the sample 6. This is called a spherical aberration. In order to solve this disadvantage, provided on the pipe 23 is a bulkhead plate (diaphragm-holding part) 34 in which a through-hole 34a of a size d4 smaller than an inner diameter d2 of the pipe 23 is formed (d4<d2). The bulkhead plate 34 separates the space 20 inside the pipe 23 (electron optical lens barrel 3) from the space 105 inside the first housing 4. The bulkhead plate 34 is thicker than the first diaphragm 10 and adapted to cause the electron beam not to pass therethrough. The first diaphragm 10 is provided to block the through-hole 34a provided in the bulkhead plate 34. The through-hole 34a is arranged near the center of the bulkhead plate 34 (optical axis 30). This makes it possible to block an electron beam passing away from the optical axis 30 as in the trajectory 32, by means of the bulkhead plate 34, and to reduce the spherical aberration described above. Note that the bulkhead plate 34 and the pipe 23 are fixed to and vacuum-sealed with each other using an adhesive material 35. It is desirable that the bulkhead plate 34 has conductive property because it takes charge by the electron beam in the trajectory 32. It is desirable that the first diaphragm 10 has conductive property because it takes charge by the electron beam in the trajectory 33. Moreover, it is desirable that the adhesive material 35 and the pipe 23 also have conductive property because the first diaphragm 10 and the bulkhead plate 34 are grounded. Moreover, it is desirable that the first diaphragm 10, the bulkhead plate 34 and the adhesive material 35 are of a non-magnetic material because they are placed in the electromagnetic field 36.

Figure 3:
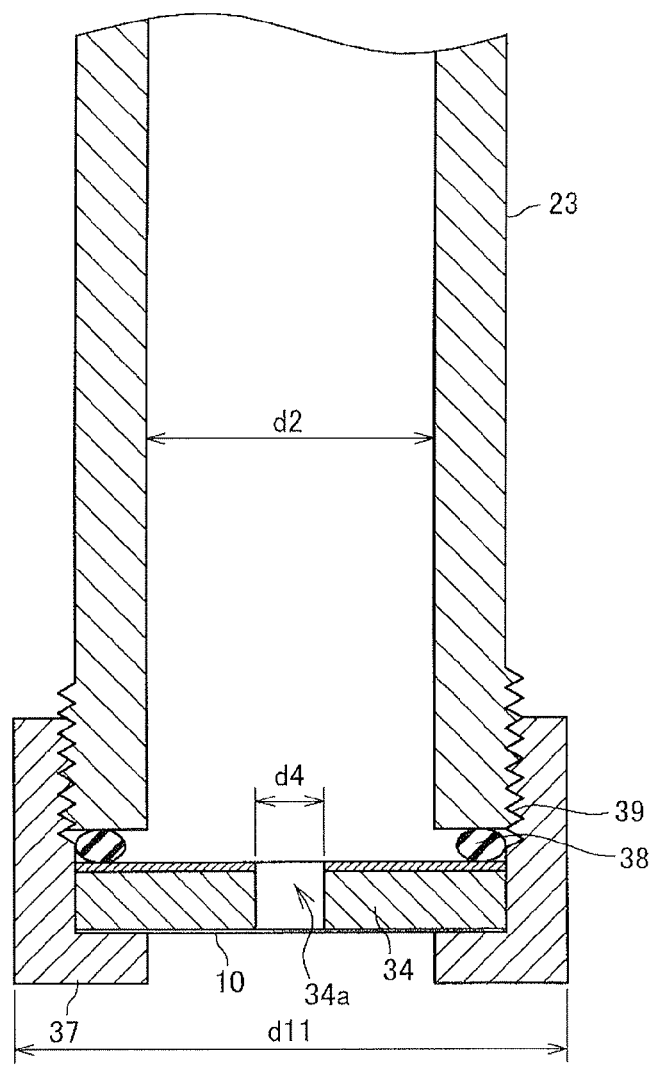
FIG. 3 is an enlarged view of a first diaphragm and its neighborhood in a modified example (the first) of the first embodiment.

FIG. 3 shows an enlarged view of the first diaphragm 10 and its neighborhood in a modified example (the first) of the first embodiment. The pipe 23 is attached, with its end surface as a seal face, firmly to the bulkhead plate 34 via a vacuum sealing part 38. A screw thread is cut on an outer circumferential surface of a tip of the pipe 23. The screw thread screws together with a screw thread cut on a fixing member 37, thereby pressing the fixing member 37 against the bulkhead plate 34 in the direction of the pipe 23 and causing the bulkhead plate 34 to be attached firmly to the end surface of the pipe 23. Note that when an outer diameter of the fixing member 37 is larger than an outer diameter of the pipe 23, the outer diameter d11 of the fixing member 37 is set to be smaller than the inner diameter d3 of the electron optical system such as the electron optical lens 1, the deflection coil 2, the electron objective lens 7 and the like (d11<d3). By this setting, it is possible to pull out the pipe 23 together with the fixing member 37 and the like from the electron optical lens barrel 3 (see FIG. 1).

Figure 4A:
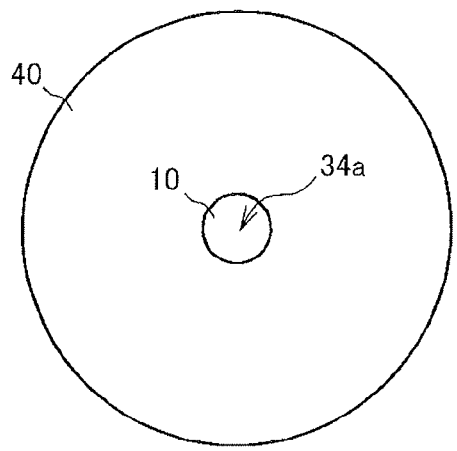
FIG. 4A is a plan view of a first diaphragm and its neighborhood in the first embodiment.
Figure 4B:
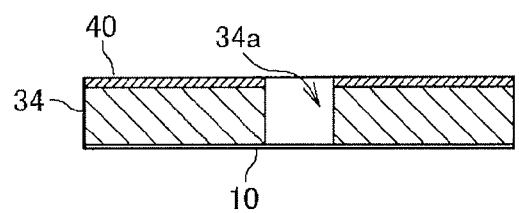
FIG. 4B is a cross-sectional view in the radial direction in FIG. 4A.

FIG. 4A shows a plan view of the first diaphragm 10 and its neighborhood in the first embodiment, and FIG. 4B shows a cross-sectional view in the radial direction in FIG. 4A. The bulkhead plate 34 is formed on the first diaphragm 10 and a conductive or semi-conductive film 40 is formed on the bulkhead plate 34. The bulkhead plate 34 and the film 40 are provided with the through-hole 34a. The through-hole 34a is blocked by the first diaphragm 10. Such structure can be produced by forming the first diaphragm 10 and the film 40 on respective surfaces of the bulkhead plate 34, forming the through-hole 34a in the film 40 and also forming the through-hole 34a in the bulkhead plate 34. As shown in FIG. 4A, the through-hole 34a is nearly a circle when viewed in plan. This makes it possible to reduce a spherical aberration equally in the circumferential direction. Since the electron beam is irradiated onto the surface of the bulkhead plate 34, the film 40 is provided not to accumulate electric charges on the surface thereof. The film 40 can be formed by vapor deposition. Note that the second diaphragm 101 can also use the same structure as the first diaphragm 10.

Figure 4C:
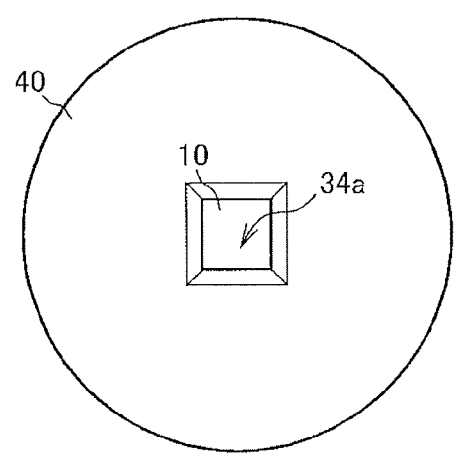
FIG. 4C is a plan view of a first diaphragm and its neighborhood in a modified example (the second) of the first embodiment.
Figure 4D:
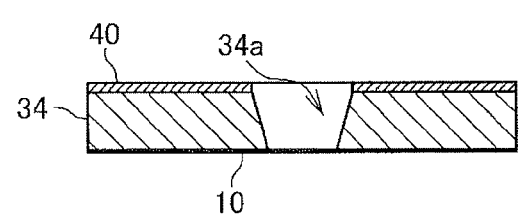
FIG. 4D is a cross-sectional view in the radial direction in FIG. 4C.

FIG. 4C shows a plan view of the first diaphragm 10 and its neighborhood in a modified example (the second) of the first embodiment, and FIG. 4D shows a cross-sectional view in the radial direction in FIG. 4C. The modified example (the second) of the first embodiment is different from the first embodiment in that, as shown in FIG. 4C, the through-hole 34a is nearly a square when viewed in plan. Moreover, as shown in FIGS. 4C and 4D, a taper is formed on a side wall of the through-hole 34a. These shapes are obtained in the case of using a monocrystalline substrate such as silicon or the like for the bulkhead plate 34. When the through-hole 34a is formed in a monocrystalline substrate by wet etching or the like, the etching rate varies depending on the crystal orientation, resulting in appearance of the square and the taper described above. Since microfabrication technology for a monocrystalline substrate such as silicon or the like is established, the monocrystalline substrate can be used when desiring to reduce the size of the through-hole 34a. The size (width) of the through-hole 34a is, for example, a size of about tens of micrometers to one millimeter. As described above, since the electron beam has to pass through the first diaphragm 10, the thickness of the first diaphragm 10 is preferably small, but the size (area) of the through-hole 34a has to be made small in order to ensure strength of the first diaphragm 10 even if the thickness of the first diaphragm 10 is small. What thickness and area are suitable depends on the resolution and the size of diaphragm required in the observation.

Regarding Lens System

Figure 5:
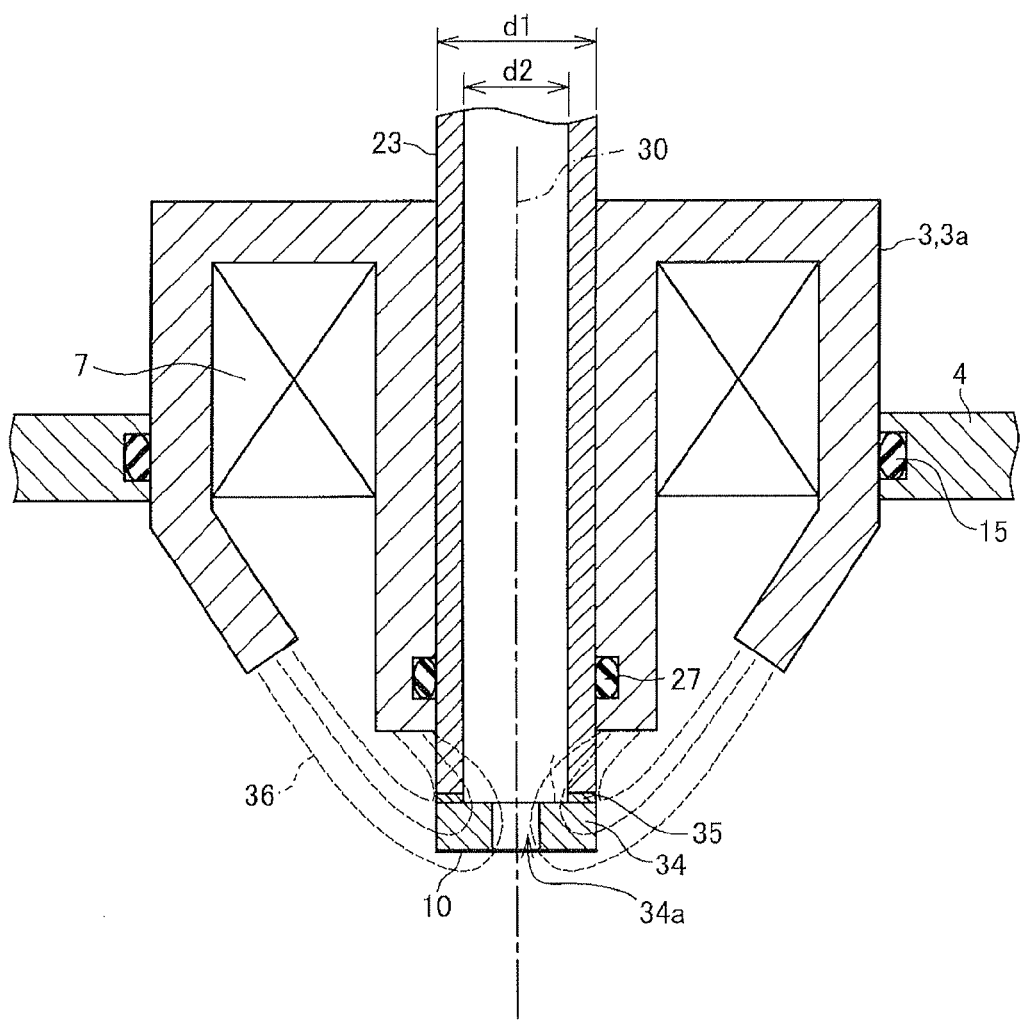
FIG. 5 is an enlarged view of an electron objective lens and its neighborhood in a modified example (the third) of the first embodiment.

FIG. 5 shows an enlarged view of the electron objective lens 7 and its neighborhood in a modified example (the third) of the first embodiment. Provided around the electron objective lens 7 is a magnetic core 3a constituting part of the electron optical lens barrel 3. An electromagnetic field 36 which is generated near a gap of the magnetic core 3a produces a lens effect by which the electron beam is focused. The electromagnetic field 36 exudes to the lower side of the magnetic core 3a (the side of the sample 6 (see FIG. 1)) and forms, what is called, a semi-in-lens system. The first diaphragm 10 is arranged at the center of lens where the most intense magnetic field appears in the lower side of the electromagnetic field 36. The gap of the magnetic core 3a is open in a nearly radial direction (direction nearly perpendicular to the optical axis 30) and the first diaphragm 10 is arranged at a position lower than the height of the gap of the magnetic core 3a. On the other hand, in the electron objective lens 7 of the first embodiment as shown in FIG. 2, the gap of the magnetic core 3a is open in the vertical direction (direction of the optical axis 30) and the first diaphragm 10 is arranged at the nearly middle height in the gap of the magnetic core 3a. The electromagnetic field 36 does not exude to the lower side of the magnetic core 3a (the side of the sample (see FIG. 1)) and forms, what is called, an out-lens system. According to the modified example (the third) of the first embodiment, it is possible to make the height of the first diaphragm 10 lower than the magnetic core 3a and to bring the first diaphragm 10 close to the sample 6 (see FIG. 1) and the second diaphragm 101. Also, it is possible to bring the high-vacuum space 20 including therein the electron source 110 (see FIG. 1), close to the sample 6 and the second diaphragm 101.

Regarding Location of First Diaphragm 10

Figure 6:
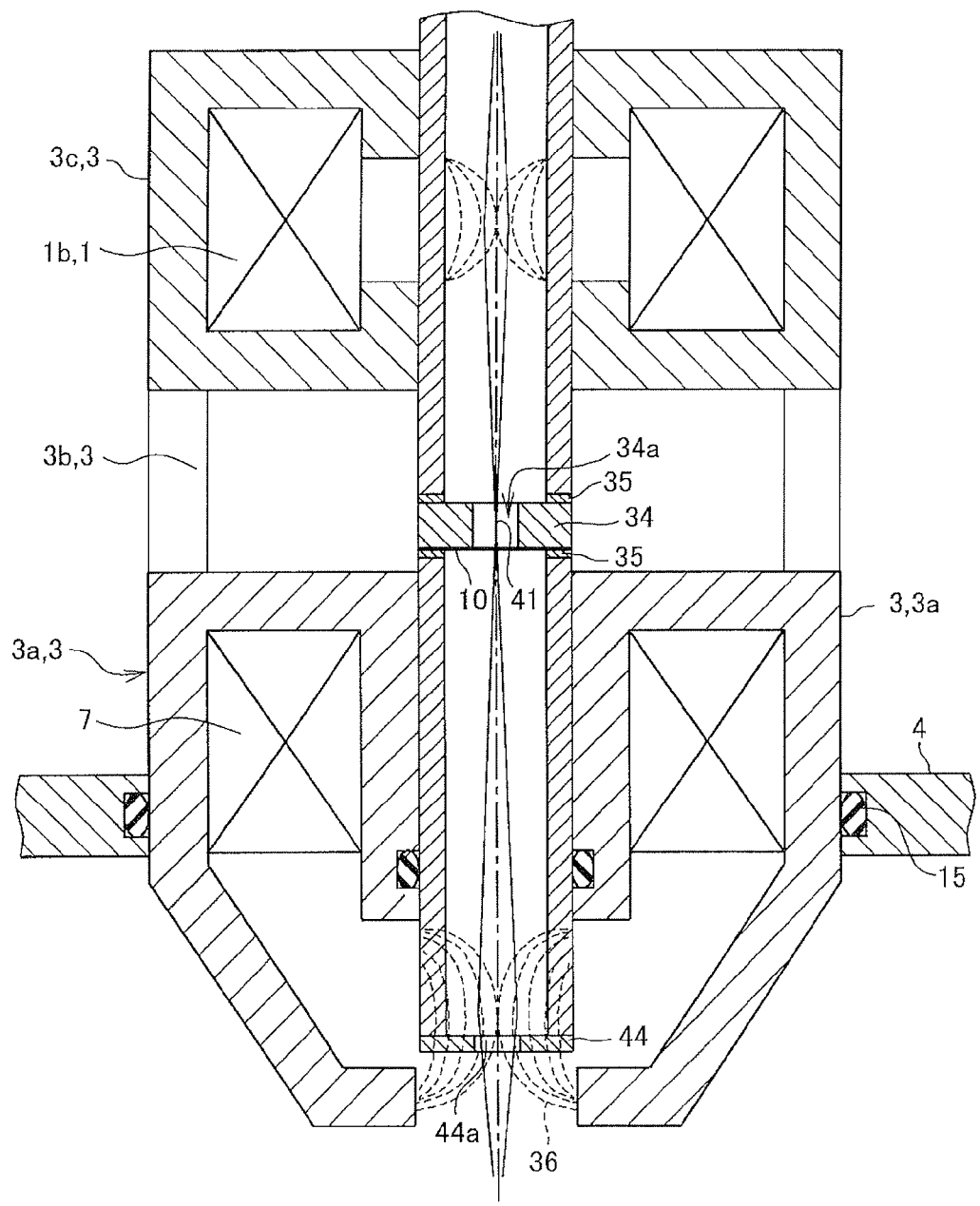
FIG. 6 is an enlarged view of an electron objective lens and its neighborhood in a modified example (the fourth) of the first embodiment.

FIG. 6 shows an enlarged view of the electron objective lens 7 and its neighborhood in a modified example (the fourth) of the first embodiment. In the first embodiment, the first diaphragm 10 is arranged at the center of lens where the most intense magnetic field appears in the electromagnetic field 36 formed by the electron objective lens 7. In the modified example (the fourth) of the first embodiment, the first diaphragm 10 is arranged between the electron source 110 and the electron objective lens 7. More specifically, the first diaphragm 10 may be arranged at the center of lens where the most intense magnetic field appears in the electromagnetic field 36 formed by the electron optical lens (condenser lens) 1 (1a, 1b, see FIG. 1). Alternatively, the first diaphragm 10 may be arranged at a crossover position where electron beams are focused between the electron optical lenses 1a and 1b, or between the electron optical lens 1b and the electron objective lens 7. At the crossover position, a plurality of electron beams cross each other. In the modified example (the fourth) of the first embodiment, description is given, as one example, of the case in which the first diaphragm 10 is arranged at a crossover position 41 (see FIG. 6) where electron beams are focused between the electron optical lens 1b and the electron objective lens 7. Provided around the electron optical lens 1b is a magnetic core 3c constituting part of the electron optical lens barrel 3. An electromagnetic field which is generated near a gap of the magnetic core 3c produces a lens effect by which the electron beams are focused. The magnetic core 3c is supported via a support barrel 3b on the magnetic core 3a. When the first diaphragm 10 is arranged at the crossover position 41, the size (area) of the through-hole 34a of the bulkhead plate 34 can be made small because the electron beams are focused on a single point to enter the first diaphragm 10. Accordingly, it is possible to thin the first diaphragm 10 while keeping its durability. Note that a shielding plate 44 with a through-hole 44a formed therein can be arranged, as an objective diaphragm, at the center of lens where the most intense magnetic field appears in the electromagnetic field 36 formed by the electron objective lens 7.

Regarding Attachable and Detachable Pipe 23

Figure 7A:
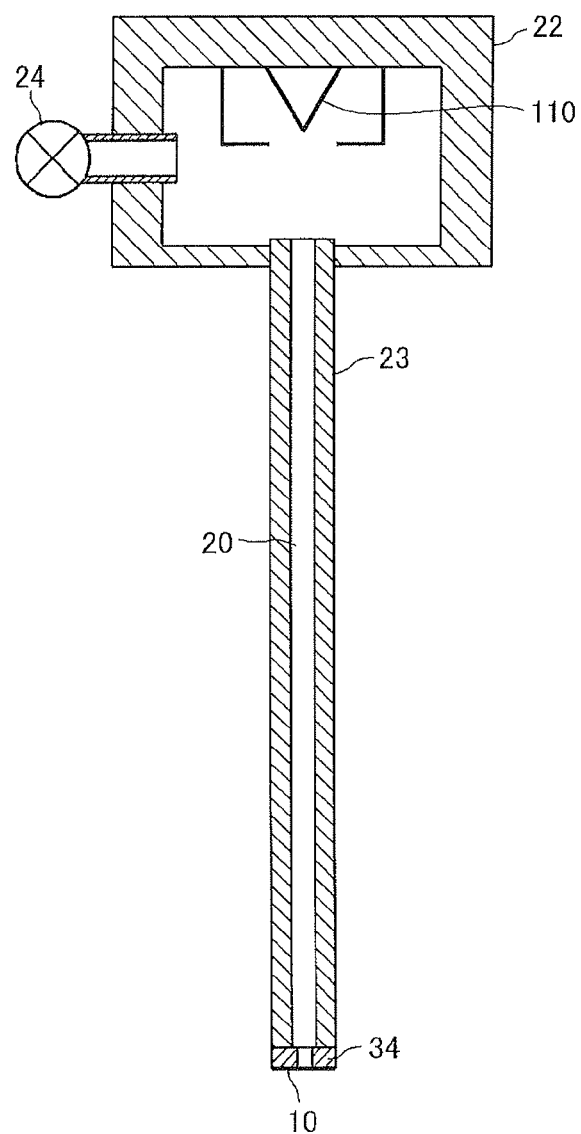
FIG. 7A is a configuration diagram of a pipe (circular pipe-shaped part) which is demounted from the body of the charged particle beam apparatus (microscope) in the first embodiment.
Figure 7B:
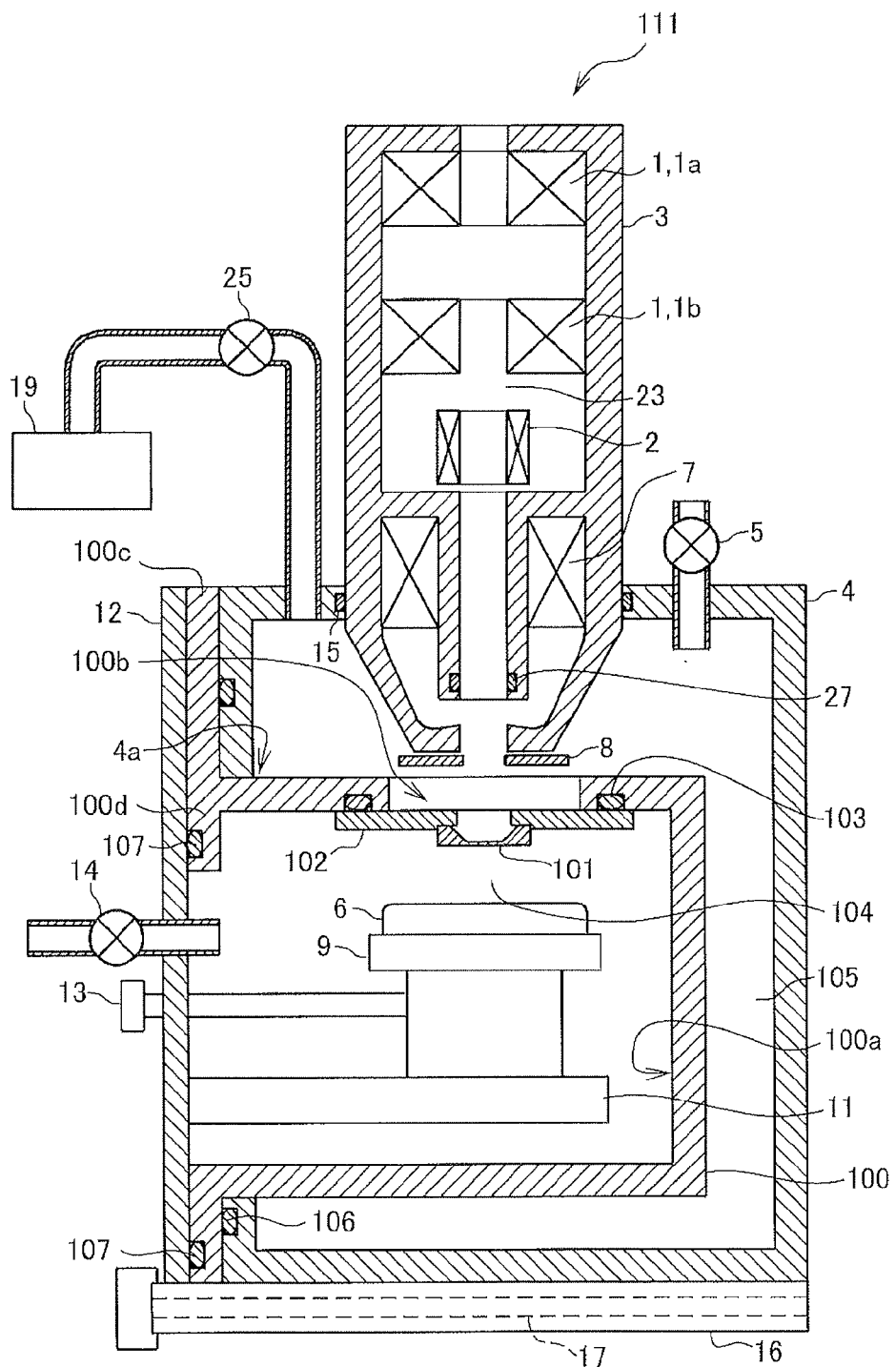
FIG. 7B is a configuration diagram of the body of the charged particle beam apparatus (microscope) from which the pipe (circular pipe-shaped part) is demounted, in the first embodiment.

FIG. 7A shows a configuration diagram of the pipe 23 which is demounted from the body of the charged particle beam apparatus 111 in the first embodiment, and of its neighborhood, and FIG. 7B shows a configuration diagram of the body of the charged particle beam apparatus 111 from which the pipe 23 is demounted. As shown in FIG. 7A, when the vacuum valve or vacuum sealing part 24 is disconnected from the vacuum pump 18 with the vacuum valve or vacuum sealing part 24 being closed, the pipe 23 can be demounted from the body of the charged particle beam apparatus 111 with the space 20 inside the third housing 22 and the pipe 23 being kept vacuum. Then, while a gas canister is connected to the vacuum valve or vacuum sealing part 24 to discharge a dry inert gas, the first diaphragm 10 can be replaced. After the replacement of the first diaphragm 10, the vacuum pump 18 is connected to the vacuum valve or vacuum sealing part 24 to perform vacuuming for the space 20. Before or after the vacuuming, the pipe 23 with the first diaphragm 10 is inserted into from above the electron optical lens barrel 3. Thus, the pipe 23 with the first diaphragm 10 is attachable to and detachable from the electron optical lens barrel 3.

Figure 8:
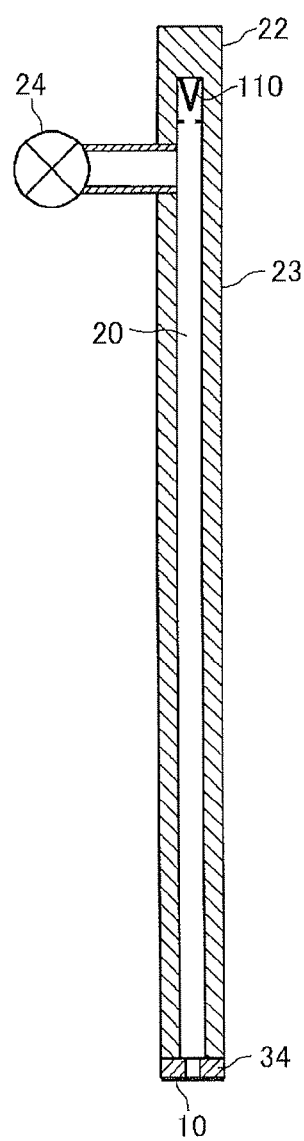
FIG. 8 is a configuration diagram of a pipe (circular pipe-shaped part) which is demounted from the body of a charged particle beam apparatus (microscope) in a modified example (the fifth) of the first embodiment.

FIG. 8 shows a configuration diagram of the pipe 23 which is demounted from the body of a charged particle beam apparatus (microscope) in a modified example (the fifth) of the first embodiment. Since a high voltage of several kilovolts to tens of kilovolts is generally applied to the electron source 110, the electron source 110 has to be kept a predetermined distance from the side wall of the third housing 22 in order to ensure a withstand voltage relative to the third housing 22. To cope with this, in the first embodiment as shown in FIG. 7A, the third housing 22 is thicker than the pipe 23. However, when the accelerating voltage is permitted to be made low, it is possible to use the pipe 23 which has the entire same thickness as shown in FIG. 8. In the first embodiment, the third housing 22 touches the electron optical lens barrel 3, thereby making it possible to uniquely determine the height at which the first diaphragm 10 should be arranged. Moreover, by interposing a spacer between the third housing 22 and the electron optical lens barrel 3, it is possible to adjust the height at which the first diaphragm 10 should be arranged. In the modified example (the fifth) of the first embodiment, it is possible to arbitrarily adjust the depth to which the pipe 23 is inserted into the electron optical lens barrel 3. Accordingly, it is possible to arbitrarily adjust the height at which the first diaphragm 10 should be arranged.

Figure 9:
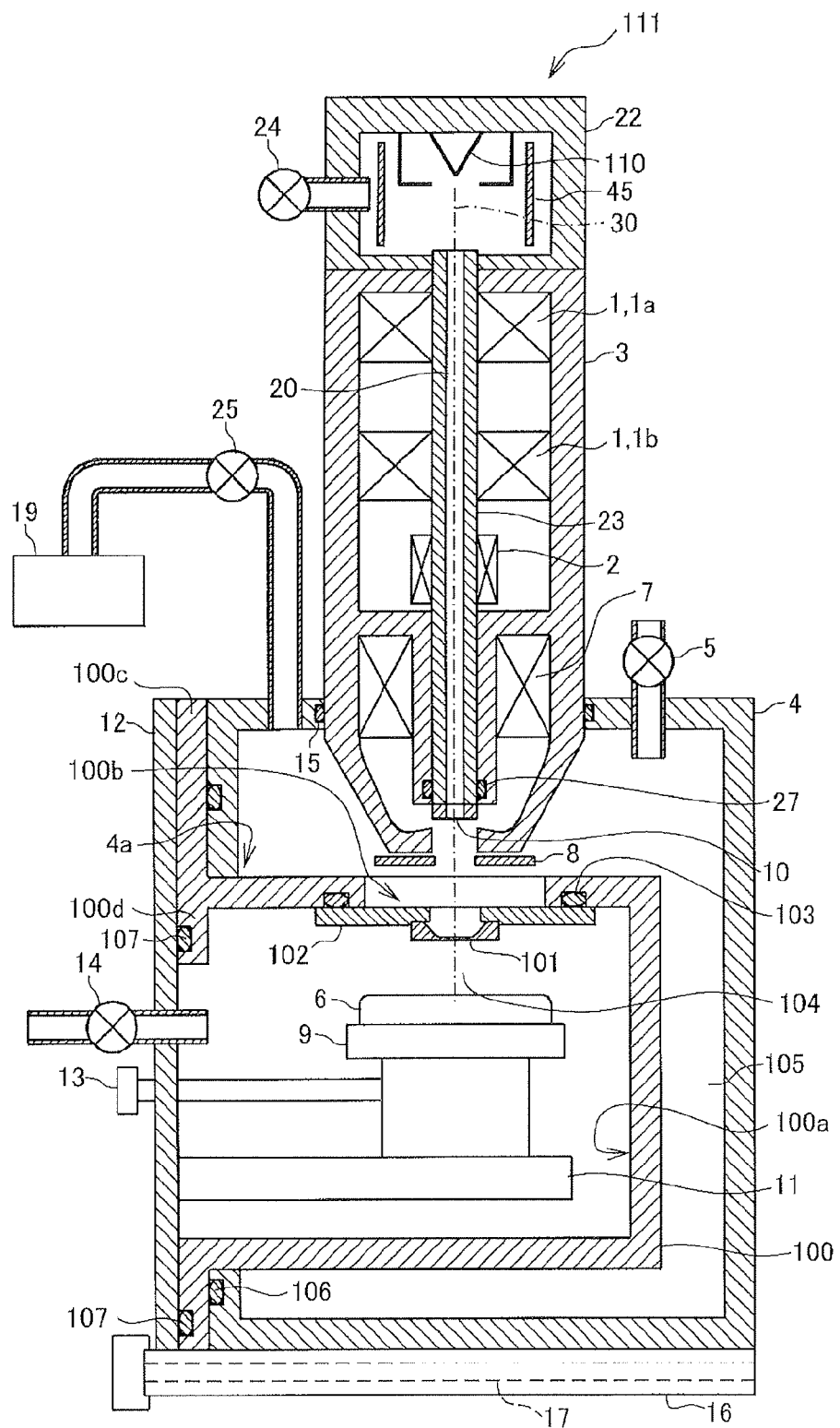
FIG. 9 is a configuration diagram of a charged particle beam apparatus (microscope) in a modified example (the sixth) of the first embodiment.

FIG. 9 shows a configuration diagram of a charged particle beam apparatus 111 in a modified example (the sixth) of the first embodiment. The modified example (the sixth) of the first embodiment is different from the first embodiment in that a non-evaporation type getter material 45 is provided. The getter material 45 can perform adsorption of gas inside the space 20 to maintain a vacuum state. Accordingly, it is possible to omit the vacuum pump 18 which can attain high-vacuum. Vacuuming from the atmospheric pressure for the space 20 is performed by first connecting a roughing pump to the vacuum valve or vacuum sealing part 24 and then performing vacuuming for the space 20 although low-vacuum. Thereafter, the vacuum valve or vacuum sealing part 24 is closed to demount the pump and the space 20 is increased to high-vacuum by the getter material 45. According to the modified example (the sixth) of the first embodiment, it is possible to attain downsizing of the charged particle beam apparatus 111 at the time of a normal observation because the vacuum pump 18 can be omitted at the time of the normal observation.

Second Embodiment

Figure 10:
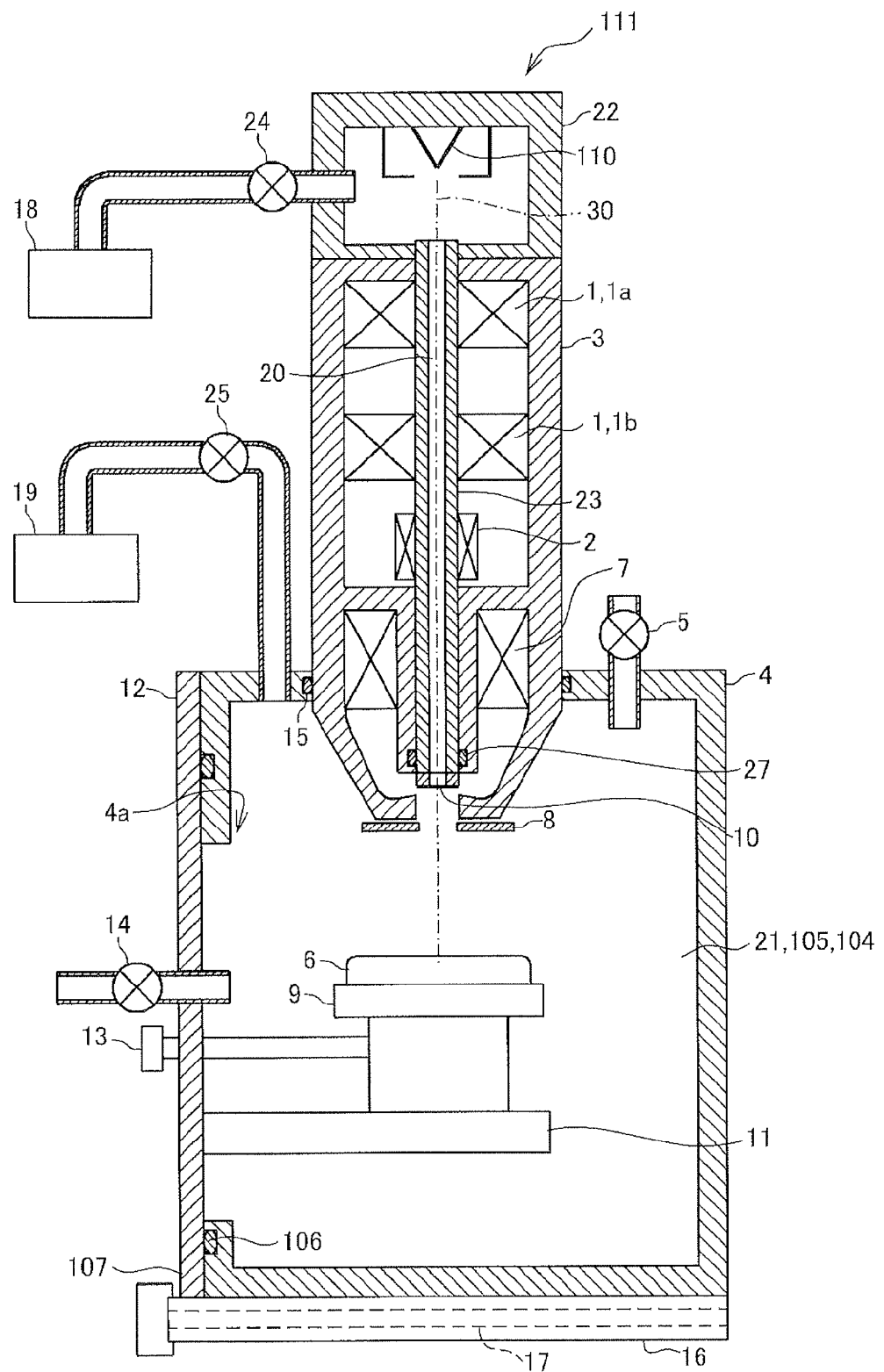
FIG. 10 is a configuration diagram of a charged particle beam apparatus (microscope) according to a second embodiment of the present invention.

FIG. 10 shows a configuration diagram of a charged particle beam apparatus (microscope) 111 according to a second embodiment of the present invention. The second embodiment is different from the first embodiment in that the attachment housing 100 with the second diaphragm 101 is demounted. This brings a space 21 surrounded by the first housing 4 and the flange 12 (corresponding to the space 104 and the space 105 in the first embodiment) into a vacuum state. The sample 6 arranged inside the space 21 can be observed under vacuum. Moreover, by performing vacuuming for the space 21 by means of the vacuum pump 19 and then introducing gas from the valve or gas inlet/outlet 5 and 14 into the space 21, it is also possible to SEM-observe the sample 6 with the space 21 being in a low-vacuum state. This is because the space 20 can be maintained at high-vacuum by the first diaphragm 10. Moreover, the first diaphragm 10 can be easily replaced in the same manner as in the first embodiment.

Note that in the second embodiment, the inside of the first housing 4 is brought into atmospheric pressure every time the sample 6 is replaced. Accordingly, when observation and replacement of the sample 6 are repeated, it is imagined that the atmospheric pressure acts on or does not act on the first diaphragm 10 and thus durability of the first diaphragm 10 becomes deteriorated as compared to the first embodiment without pressure fluctuation. In view of this, when the charged particle beam apparatus 111 is used in the second embodiment or used in a combination of the first embodiment and the second embodiment, it is desirable to use the first diaphragm 10 with enhanced durability as compared to the case where the charged particle beam apparatus 111 is used in the first embodiment. It is only necessary to thicken the first diaphragm 10 and/or reduce the size of the through-hole 34a of the bulkhead plate 34 in order to enhance the durability.

REFERENCE SIGNS LIST 1, 1a, 1b Electron optical lens (Electron (Charged particle) optical system, Condenser lens)
2 Deflection coil (Electron (Charged particle) optical system)
3 Electron optical (Charged particle optical) lens barrel
3a Magnetic core
3b Support barrel
3c Magnetic core
4 First housing (Sample housing)
4a Opening of first housing
5 Valve or gas inlet/outlet
6 Sample
7 Electron objective lens (Electron (Charged particle) optical system)
8 Detector
9 Sample holder
10 First diaphragm
11 Sample stage
12 Stage-attached plate member (Flange)
13 Stage-positioning knob
14 Valve or gas inlet/outlet
15 Vacuum sealing part
16 Guide
17 Rail
18, 19 Vacuum pump 20 Space between electron source 110 and first diaphragm 10 (Space inside lens barrel)
21 Space in sample environs (Space inside first housing)
22 Third housing (Circular pipe-shaped part)
23 Pipe (Circular pipe-shaped part)
24 Vacuum valve or vacuum sealing part
25 Valve
27 Vacuum sealing part
30 Optical axis
32 Charged particle beam (Trajectory passing away from optical axis)
33 Charged particle beam (Trajectory passing near optical axis)
34 Diaphragm-holding part (Bulkhead plate)
34a Through-hole
35 Adhesive material
36 Electromagnetic field
37 Fixing member
38 Vacuum sealing part
39 Screw thread
40 Conductive or semi-conductive film
41 Crossover position (Position where charged particle beams cross)
44 Shielding plate (Member provided with through-hole)
44a Through-hole
45 Getter material (Non-evaporation type getter material)
100 Attachment housing (Second housing)
100a Recessed section of second housing
100b Through-hole
100c Flange
100d Guard
101 Second diaphragm (Objective diaphragm)
102 Flange
103 Vacuum sealing part
104 Space between second diaphragm and sample
105 Space between first diaphragm and second diaphragm (Space surrounded by first housing and second housing)
106, 107 Vacuum sealing part
110 Electron source (Charged particle source)
111 Charged particle beam apparatus (Charged particle beam microscope)
d1 Outer diameter of pipe
d2 Inner diameter of pipe
d3 Inner diameter of coil for electromagnetic field formation in electron optical system
d4 Hole size of through-hole of bulkhead plate
d5 Distance between second diaphragm and sample

The invention claimed is:

1. A charged particle beam apparatus comprising:
a charged particle source which emits a charged particle beam;
a charged particle optical system which focuses the charged particle beam and controls an optical axis;
a lens barrel which holds the charged particle source and the charged particle optical system;
a first housing which is connected to the lens barrel and into which the charged particle beam is emitted;
a second housing which is recessed to inside the first housing from an opening of the first housing;
a first diaphragm which is arranged on the optical axis and separates a space inside the lens barrel from a space inside the first housing, and through which the charged particle beam passes; and
a second diaphragm which is arranged on the optical axis and separates spaces inside and outside a recessed section of the second housing from each other, and through which the charged particle beam passes, wherein
a space surrounded by the first housing and the second housing is depressurized, and a sample arranged inside the recessed section of the second housing is irradiated with the charged particle beam.

2. The charged particle beam apparatus according to claim 1, wherein the first diaphragm is arranged in an electromagnetic field formed by the charged particle optical system.

3. The charged particle beam apparatus according to claim 1, wherein the first diaphragm is arranged at a position where a plurality of charged particle beams cross.

4. The charged particle beam apparatus according to claim 1, further comprising a pipe arranged to be connected to a third housing which accommodates therein the charged particle source, to pass through the charged particle optical system, and to allow the optical axis to pass inside the pipe, wherein
the first diaphragm is attached to the pipe, and
the pipe and the third housing are attachable to and detachable from the lens barrel in a direction of the optical axis.

5. The charged particle beam apparatus according to claim 4, wherein an outer diameter of the pipe is smaller than an inner diameter of a coil for electromagnetic field formation included in the charged particle optical system.

6. The charged particle beam apparatus according to claim 4, further comprising a bulkhead plate which is provided on the pipe, separates the space inside the lens barrel from the space inside the first housing, and is thicker than the first diaphragm, and through which the charged particle beam does not pass, wherein
the first diaphragm is provided to block a through-hole provided in the bulkhead plate, and
a hole size of the through-hole provided in the bulkhead plate is smaller than an inner diameter of the pipe.

7. The charged particle beam apparatus according to claim 4, wherein the first diaphragm separates a space inside the pipe communicating with a space inside the third housing, from the space inside the first housing, and
the pipe and the third housing are attachable to and detachable from the lens barrel with the inside of the pipe and the inside of the third housing being in vacuum state when the space surrounded by the first housing and the second housing is under atmospheric pressure.

8. The charged particle beam apparatus according to claim 1, wherein a vacuum valve or a vacuum sealing part that brings a space from the charged particle source to the first diaphragm into an airtight state, and a non-evaporation type getter material that that brings the space from the charged particle source to the first diaphragm into a depressurized state, are provided on a wall surface that demarcates the space from the charged particle source to the first diaphragm.

9. The charged particle beam apparatus according to claim 1, wherein a thickness of the first diaphragm and the second diaphragm is equal to or less than 100 nm.

10. The charged particle beam apparatus according to claim 1, wherein a distance between the second diaphragm and the sample is set to be equal to or less than 1000 μm when the sample is irradiated with the charged particle beam.

11. A charged particle beam apparatus comprising:
a charged particle source which emits a charged particle beam;
a charged particle optical system which focuses the charged particle beam and controls an optical axis;
a lens barrel which holds the charged particle source and the charged particle optical system;
a pipe arranged to be connected to a housing which accommodates therein the charged particle source, to pass through the charged particle optical system, and to allow the optical axis to pass inside the pipe; and a diaphragm which is attached to the pipe and arranged on the optical axis and separates a space inside the pipe communicating with a space inside the housing, from a space outside the pipe, and through which the charged particle beam passes, wherein the diaphragm and the pipe are attachable to and detachable from the lens barrel when the housing is moved in a direction of the optical axis.

12. The charged particle beam apparatus according to claim 11, further comprising a sample housing which is connected to the lens barrel and into which the charged particle beam is emitted, wherein the sample is irradiated with the charged particle beam inside the sample housing which is depressurized.

13. The charged particle beam apparatus according to claim 11, further comprising:

a first housing which is connected to the lens barrel and into which the charged particle beam is emitted;

a second housing which is recessed to inside the first housing from an opening of the first housing; and an objective diaphragm which is arranged on the optical axis and separates spaces inside and outside a recessed section of the second housing from each other, and through which the charged particle beam passes, wherein a space surrounded by the first housing and the second housing is depressurized, and a sample arranged inside the recessed section of the second housing is irradiated with the charged particle beam.

14. The charged particle beam apparatus according to claim 11, further comprising a bulkhead plate which is provided on the pipe, separates the space inside the pipe communicating with the space inside the housing, from the space outside the pipe, and is thicker than the diaphragm, and through which the charged particle beam does not pass, wherein the diaphragm is provided to block a through-hole provided in the bulkhead plate, and a hole size of the through-hole provided in the bulkhead plate is smaller than an inner diameter of the pipe.

\* \* \* \* \*